United States Patent
Huo et al.

(10) Patent No.: US 10,878,911 B2
(45) Date of Patent: *Dec. 29, 2020

(54) MEMORY DEVICE USING COMB-LIKE ROUTING STRUCTURE FOR REDUCED METAL LINE LOADING

(71) Applicant: Yangtze Memory Technologies Co., Ltd., Hubei (CN)

(72) Inventors: Zongliang Huo, Hubei (CN); Jun Liu, Hubei (CN); Zhiliang Xia, Hubei (CN); Li Hong Xiao, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/713,401

(22) Filed: Dec. 13, 2019

(65) Prior Publication Data
US 2020/0176058 A1 Jun. 4, 2020

Related U.S. Application Data

(63) Continuation of application No. 16/165,660, filed on Oct. 19, 2018, now Pat. No. 10,510,415, which is a
(Continued)

(51) Int. Cl.
*G11C 16/08* (2006.01)
*G11C 16/04* (2006.01)
(Continued)

(52) U.S. Cl.
CPC .......... *G11C 16/08* (2013.01); *G11C 16/0483* (2013.01); *H01L 27/11556* (2013.01);
(Continued)

(58) Field of Classification Search
CPC ................ G11C 16/08; G11C 16/0483; H01L 27/11556; H01L 27/11573;
(Continued)

(56) References Cited

U.S. PATENT DOCUMENTS 7,977,725 B2 * 7/2011 Yoon .................. H01L 21/8221
257/296
9,236,394 B2 * 1/2016 Rhie ...................... G11C 16/14
(Continued)

FOREIGN PATENT DOCUMENTS

CN 101038906 A 9/2007
CN 107658315 A 2/2018
(Continued)

OTHER PUBLICATIONS

International Search Report and Written Opinion of the Interntional Search Authority directed to related PCT Application No. PCT/CN2018/104801, dated Jun. 10, 2019; 8 pages.

*Primary Examiner* — Tri M Hoang
(74) *Attorney, Agent, or Firm* — Sterne, Kessler, Goldstein & Fox P.L.L.C.

(57) ABSTRACT

A memory device includes a first semiconductor structure and a second semiconductor structure. The first semiconductor structure includes a first substrate and one or more peripheral devices on the first substrate. The second semiconductor structure includes a first set of conductive lines electrically coupled with a first set of a plurality of vertical structures and a second set of conductive lines electrically coupled with a second set of the plurality of vertical structures different from the first set of the plurality of vertical structures. The first set of conductive lines are vertically distanced from one end of the plurality of vertical structures and the second set of conductive lines are vertically distanced from an opposite end of the plurality of vertical structures.

20 Claims, 13 Drawing Sheets

Related U.S. Application Data continuation of application No. PCT/CN2018/104801, filed on Sep. 10, 2018.

(51) Int. Cl.
| | |
|---|---|
| *H01L 27/11556* | (2017.01) |
| *H01L 27/11573* | (2017.01) |
| *H01L 27/11582* | (2017.01) |
| *H01L 29/423* | (2006.01) |
| *H01L 29/66* | (2006.01) |
| *H01L 29/786* | (2006.01) |
| *H01L 29/792* | (2006.01) |

(52) U.S. Cl.
CPC .. *H01L 27/11573* (2013.01); *H01L 27/11582* (2013.01); *H01L 29/42384* (2013.01); *H01L 29/66757* (2013.01); *H01L 29/78642* (2013.01); *H01L 29/7926* (2013.01)

(58) Field of Classification Search
CPC ......... H01L 27/11582; H01L 29/42384; H01L 29/66757; H01L 29/78642; H01L 29/7926
See application file for complete search history.

(56) References Cited

U.S. PATENT DOCUMENTS

| | | | |
|---|---|---|---|
| 10,510,415 B1* | 12/2019 | Huo | H01L 27/11556 |
| 2009/0267128 A1 | 10/2009 | Maejima | |
| 2010/0133599 A1 | 6/2010 | Chae et al. | |
| 2012/0181602 A1* | 7/2012 | Fukuzumi | H01L 27/1207 257/326 |
| 2012/0241846 A1 | 9/2012 | Kawasaki et al. | |
| 2013/0083601 A1* | 4/2013 | Liu | G11C 16/16 365/185.17 |
| 2015/0137210 A1* | 5/2015 | Nam | H01L 29/66833 257/324 |
| 2015/0279852 A1* | 10/2015 | Mizutani | H01L 27/11524 257/315 |
| 2016/0197041 A1 | 7/2016 | Lai et al. | |
| 2016/0358927 A1* | 12/2016 | Nam | H01L 27/11582 |
| 2017/0092651 A1* | 3/2017 | Kim | H01L 27/11582 |
| 2020/0082886 A1* | 3/2020 | Huo | H01L 27/11573 |

FOREIGN PATENT DOCUMENTS

| | | |
|---|---|---|
| CN | 107658317 A | 2/2018 |
| WO | WO 2019052127 A1 | 3/2019 |

* cited by examiner

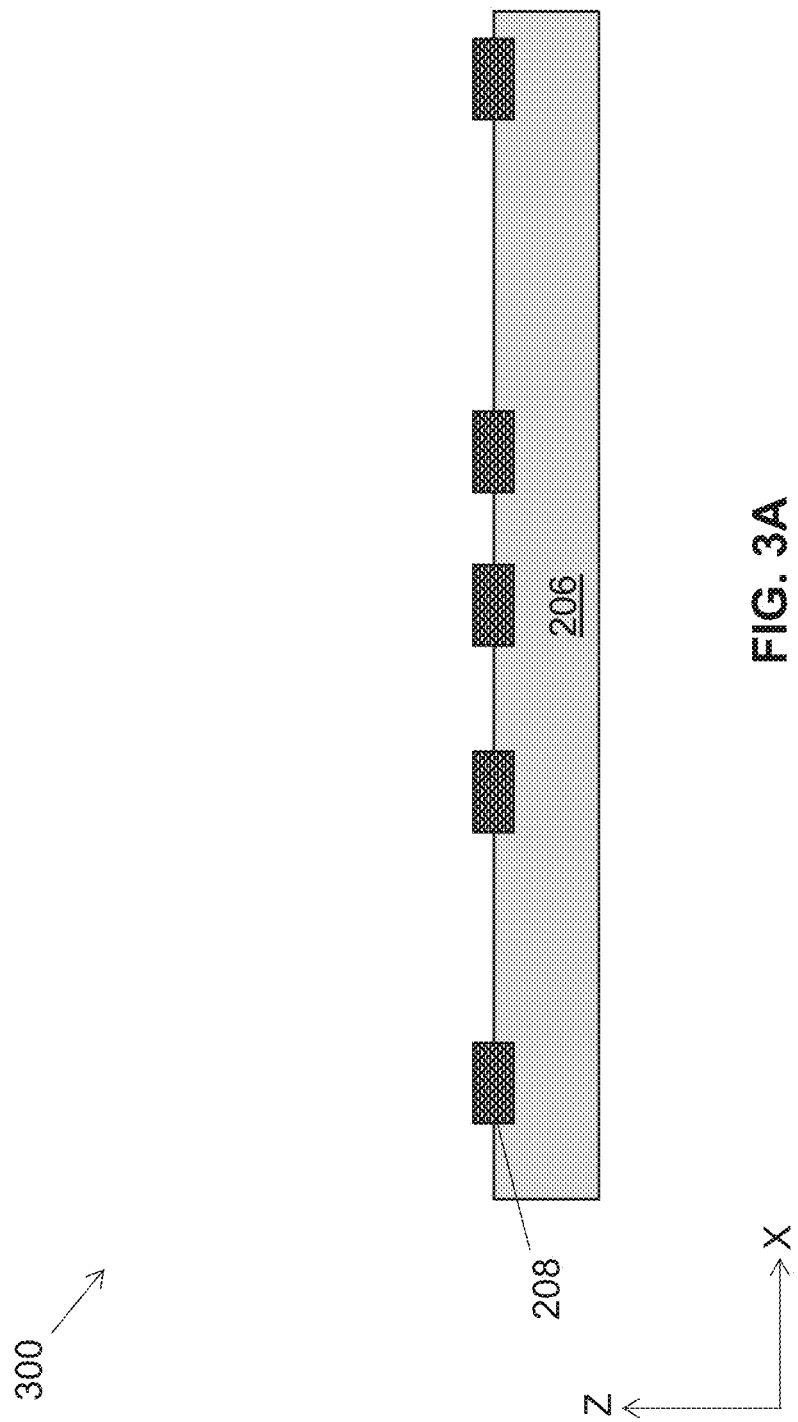

MEMORY DEVICE USING COMB-LIKE ROUTING STRUCTURE FOR REDUCED METAL LINE LOADING

CROSS-REFERENCE TO RELATED APPLICATIONS AND INCORPORATION BY REFERENCE

This application is a continuation of U.S. patent application Ser. No. 16/165,660, filed on Oct. 19, 2018, now U.S. Pat. No. 10,510,415 issued on Dec. 17, 2019 which claims priority to International Application No. PCT/CN2018/104801, filed on Sep. 10, 2018, the disclosures of which are incorporated herein by reference in their entireties.

BACKGROUND

Embodiments of the present disclosure relate to three-dimensional (3D) memory devices and fabrication methods thereof.

Flash memory devices have undergone rapid development. Flash memory devices can store data for a considerably long time without powering (i.e., they are a form of non-volatile memory), and have advantages such as high integration level, fast access, easy erasing, and rewriting. To further improve the bit density and reduce cost of flash memory devices, three-dimensional NAND flash memory devices have been developed.

A three-dimensional NAND flash memory device includes a stack of gate electrodes arranged over a substrate, with a plurality of semiconductor channels through and intersecting word lines, into the p- and/or n-type implanted substrate. The bottom/lower gate electrodes function as bottom/lower selective gates (BSG). The top/upper gate electrodes function as top/upper selective gates (TSG). Back-End-of Line (BEOL) Metal plays the role of Bit-Lines (BLs). The word lines/gate electrodes between the top/upper selective gate electrodes and the bottom/lower gate electrodes function as word lines (WLs). The intersection of a word line and a semiconductor channel forms a memory cell. WLs and BLs are typically laid perpendicular to each other (e.g., in an X-direction and a Y-direction), and TSGs are laid in a direction perpendicular to both the WLs and BLs (e.g., in a Z-direction.)

BRIEF SUMMARY

Embodiments of three-dimensional memory device architectures and fabrication methods therefore are disclosed herein. The disclosed structures and methods provide a staggered fabrication for various metal lines, such as the bit lines, to reduce the density of the metal lines on the same plane. Reducing the metal line density leads to reduced cross-talk between the lines and faster program speeds.

In some embodiments, a memory device includes a first semiconductor structure and a second semiconductor structure. The first semiconductor structure includes a first substrate and one or more peripheral devices on the first substrate. The first semiconductor structure also includes one or more interconnect layers having a first conductor layer. The second semiconductor structure includes a second substrate and a layer stack having alternating conductor and insulator layers disposed above a first surface of the second substrate. The second semiconductor structure also includes a plurality of structures extending vertically through the layer stack. The second semiconductor structure also includes a first set of conductive lines electrically coupled with a first set of the plurality of structures and a second set of conductive lines electrically coupled with a second set of the plurality of structures different from the first set. The first set of conductive lines are vertically distanced from one end of the plurality of structures and the second set of conductive lines are vertically distanced from an opposite end of the plurality of structures.

In some embodiments, a memory device includes a substrate and a layer stack having alternating conductor and insulator layers disposed above a first surface of the substrate. The memory device also includes a plurality of structures extending vertically through the layer stack. The memory device also includes a first set of conductive lines electrically coupled with a first set of the plurality of structures and a second set of conductive lines electrically coupled with a second set of the plurality of structures different from the first set. The first set of conductive lines are vertically distanced from one end of the plurality of structures and the second set of conductive lines are vertically distanced from an opposite end of the plurality of structures. The memory device also includes one or more interconnect layers having a first conductor layer at a top surface of the memory device, and a bond interface at the top surface of the memory device. Another semiconductor device is configured to bond with the memory device at the bond interface.

In some embodiments, the second semiconductor structure further includes one or more second interconnect layers, the one or more second interconnect layers including a second conductor layer.

In some embodiments, the memory device further includes a bond interface between the first semiconductor structure and the second semiconductor structure, wherein the first conductor layer contacts the second conductor layer at the bond interface.

In some embodiments, the plurality of structures includes one or more NAND memory strings.

In some embodiments, the one or more NAND strings each includes a plurality of layers surrounding a core insulating material, wherein the plurality of layers includes a blocking layer, a storage layer, a tunneling layer, and a channel layer.

In some embodiments, the conductive material includes doped polysilicon.

In some embodiments, the plurality of structures comprises one or more conductive contacts.

In some embodiments, the first set of the plurality of structures includes only the NAND memory strings and the second set of the plurality of structures includes only the conductive contacts.

In some embodiments, the second set of conductive lines are located on an opposite side of the second substrate from the first set of conductive lines.

In some embodiments, the first semiconductor structure further includes a plurality of conductive pads configured to provide electrical connection to external devices.

In some embodiments, the second semiconductor structure further includes a plurality of conductive pads configured to provide electrical connection to external devices.

In some embodiments, a method to form a memory device includes forming a layer stack over a first substrate, the first layer stack including alternating conductor and insulator layers, and forming a plurality of structures extending vertically through the layer stack. The method also includes forming a first set of conductive lines over one end vertically distanced from the plurality of structures. The first set of conductive lines are electrically coupled to a first set of the plurality of structures. The method also includes forming one or more peripheral devices on a second substrate. The method further includes bonding the first substrate with the second substrate at a bond interface between the first substrate and the second substrate, and forming a second set of conductive lines over an opposite end vertically distanced from the plurality of structures. The second set of conductive lines are electrically coupled to a second set of the plurality of structures.

In some embodiments, the method further includes forming one or more interconnect layers over the plurality of structures before the bonding, the one or more interconnect layers including a first conductor layer.

In some embodiments, the method further includes forming one or more second interconnect layers over the one or more peripheral devices before the bonding, the one or more interconnect layers including a second conductor layer.

In some embodiments, the first conductor layer contacts the second conductor layer during the bonding of the first substrate with the second substrate.

In some embodiments, bonding the first substrate and the second substrate comprises bonding the first and second substrates by hybrid bonding.

In some embodiments, forming the plurality of structures includes depositing a plurality of memory layers comprising a blocking layer, a storage layer, a tunneling layer, and a channel layer, and depositing a core insulator material.

In some embodiments, forming the plurality of structures includes forming a conductive contact coupled to a conductive line of the second set of conductive lines.

In some embodiments, the method further includes forming one or more conductive pads on the first substrate, the one or more conductive pads being configured to provide electrical connection to external devices.

In some embodiments, the method further includes forming one or more conductive pads on the second substrate, the one or more conductive pads being configured to provide electrical connection to external devices.

The three-dimensional memory devices provided by the present disclosure include bit lines and other metal routing lines that are provided at different heights above (or below) the substrate such that they are not densely packed on the same plane.

BRIEF DESCRIPTION OF THE DRAWINGS

Aspects of the present disclosure are best understood from the following detailed description when reading with the accompanying figures. It is noted that, in accordance with the common practice in the industry, various features are not drawn to scale. In fact, the dimensions of the various features may be arbitrarily increased or reduced for clarity of illustration and discussion.

FIGS. 3A-3C illustrate side views of a three-dimensional memory structure at different stages of an exemplary fabrication process, according to some embodiments.

DETAILED DESCRIPTION

Figure 1:
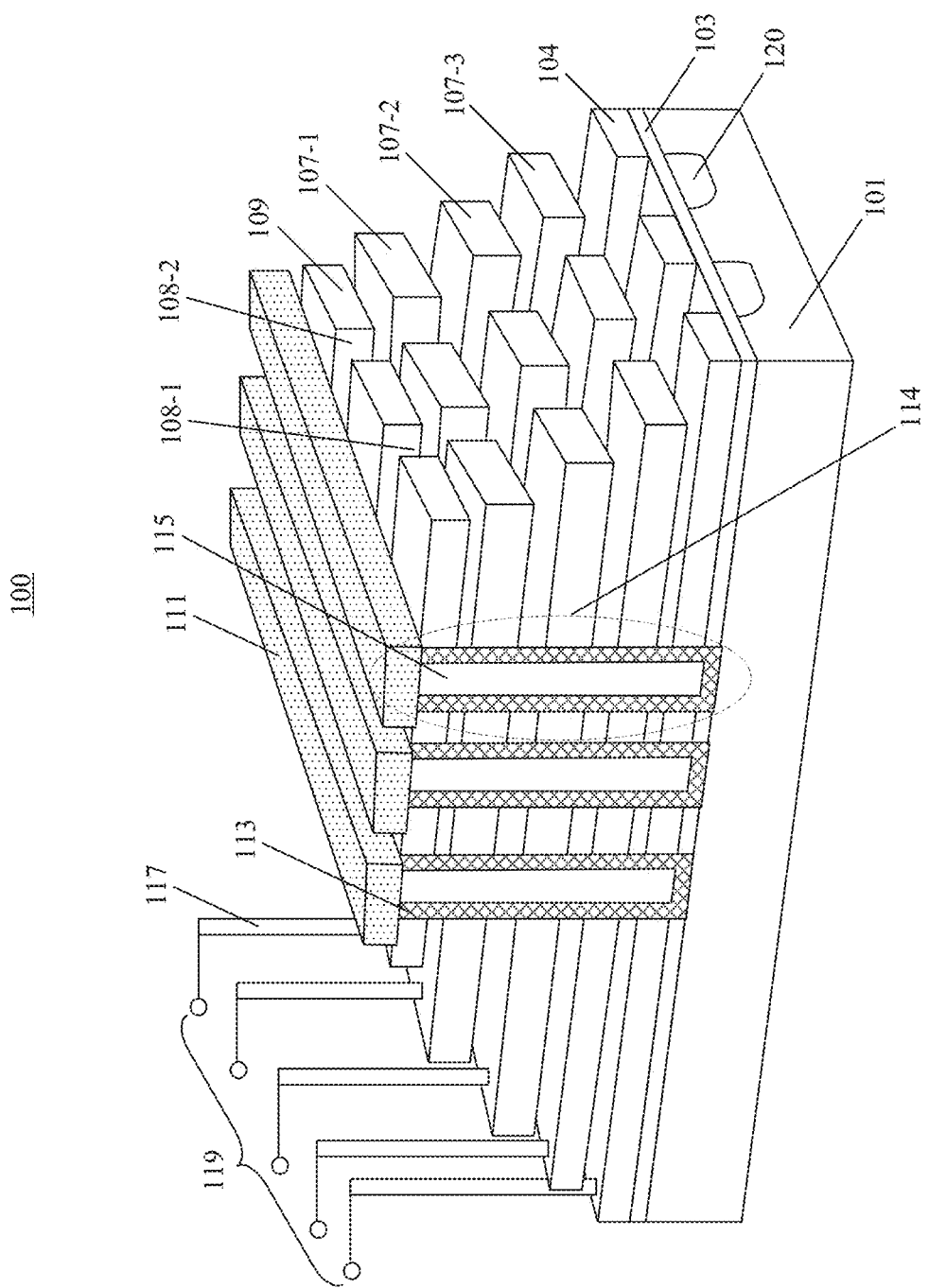
FIG. 1 is an illustration of a three-dimensional memory device.

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND strings) on a laterally-oriented substrate so that the memory strings extend in the vertical direction with respect to the substrate. As used herein, the term "vertical/vertically" means nominally perpendicular to the lateral surface of a substrate.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

FIG. 1 illustrates a portion of a three-dimensional NAND flash memory device 100. The flash memory device 100 includes a substrate 101, an insulating layer 103 over substrate 101, a tier of lower selective gate electrodes 104 over the insulating layer 103, and a plurality of tiers of control gate electrodes 107 stacking on top of bottom selective gate electrodes 104 to form an alternating conductor/dielectric stack. The flash memory device also includes a tier of upper selective gate electrodes 109 over the stack of control gate electrodes 107, doped source line regions 120 in portions of substrate 101 between adjacent lower selective gate electrodes 104, and NAND strings 114 through upper selective gate electrodes 109, control gate electrodes 107, lower selective gate electrodes 104, and insulating layer 103. NAND strings 114 includes a memory film 113 over the inner surface of NAND strings 114 and a core filling film 115 surrounded by memory film 113. The flash memory device 100 further includes a plurality of bit lines 111 connected to NAND strings 114 over upper selective gate electrodes 109 and a plurality of metal interconnects 119 connected to the gate electrodes through a plurality of metal contacts 117. Insulating layers between adjacent tiers of gate electrodes are not shown in FIG. 1 for clarity. The gate electrodes include upper selective gate electrodes 109, control gate electrodes 107 (e.g., also referred to as the word lines), and lower selective gate electrodes 104.

In FIG. 1, for illustrative purposes, three tiers of control gate electrodes 107-1, 107-2, and 107-3 are shown together with one tier of upper selective gate electrodes 109 and one tier of lower selective gate electrodes 104. Each tier of gate electrodes have substantially the same height over substrate 101. The gate electrodes of each tier are separated by gate line slits 108-1 and 108-2 through the stack of gate electrodes. Each of the gate electrodes in a same tier is conductively connected to a metal interconnect 119 through a metal contact 117. That is, the number of metal contacts formed on the gate electrodes equals the number of gate electrodes (i.e., the sum of all upper selective gate electrodes 109, control gate electrodes 107, and lower selective gate electrodes 104). Further, the same number of metal interconnects is formed to connect to each metal contact via. In some arrangements, additional metal contacts are formed to connect to other structures beyond the gate electrodes, such as, for example, dummy structures.

When forming NAND strings 114, other vertical structures may also be formed that extend through the tiers of control gate electrodes 107-1, 107-2, and 107-3 down to substrate 101. Examples of other vertical structures include through array contacts (TACs) that may be used to make electrical connection with components above and/or below the tiers of gate electrodes. These other vertical structures are not illustrated in FIG. 1 for clarity.

Figure 2:
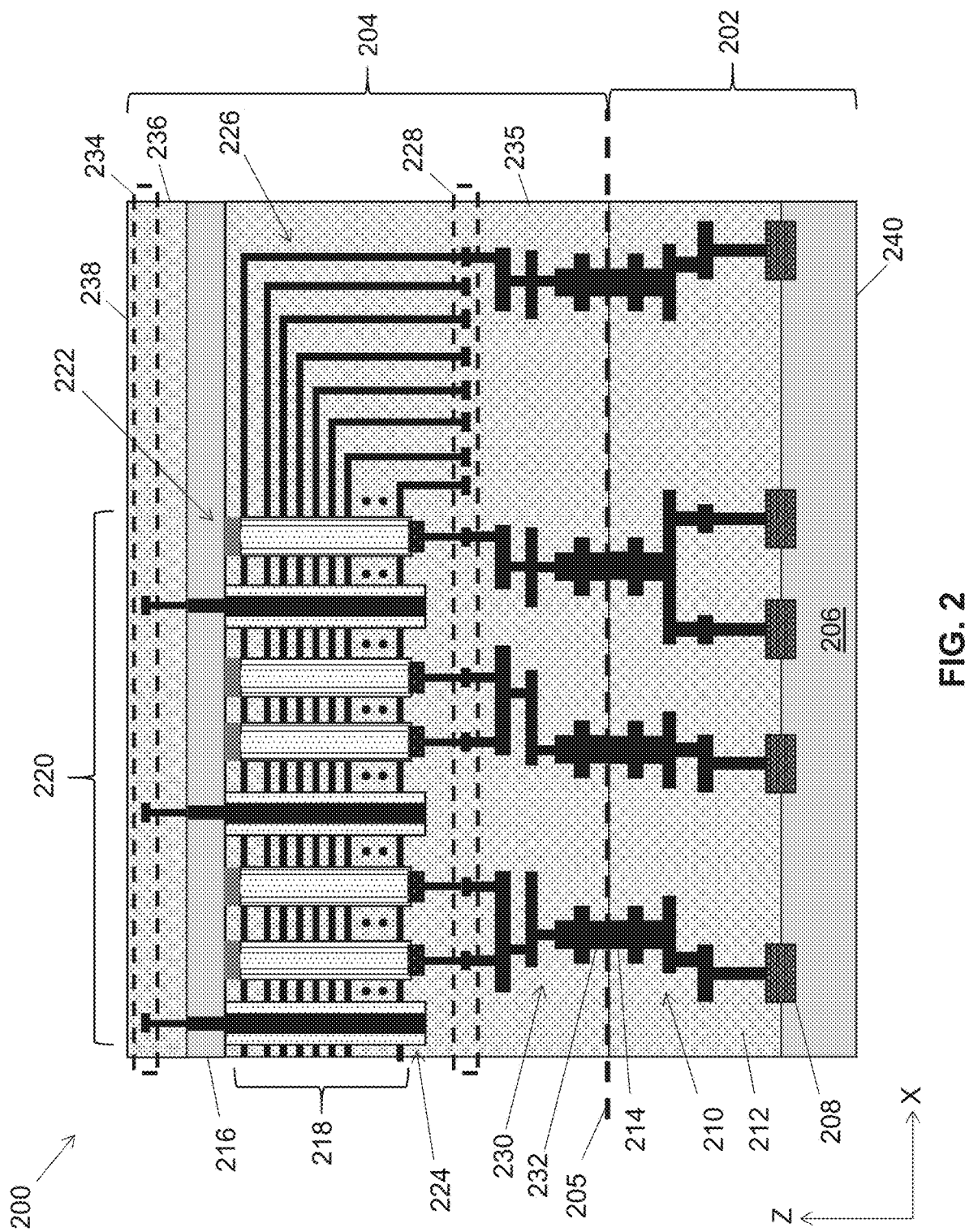
FIG. 2 illustrates a cross-section view of a three-dimensional memory device, according to some embodiments.
Figure 3B:
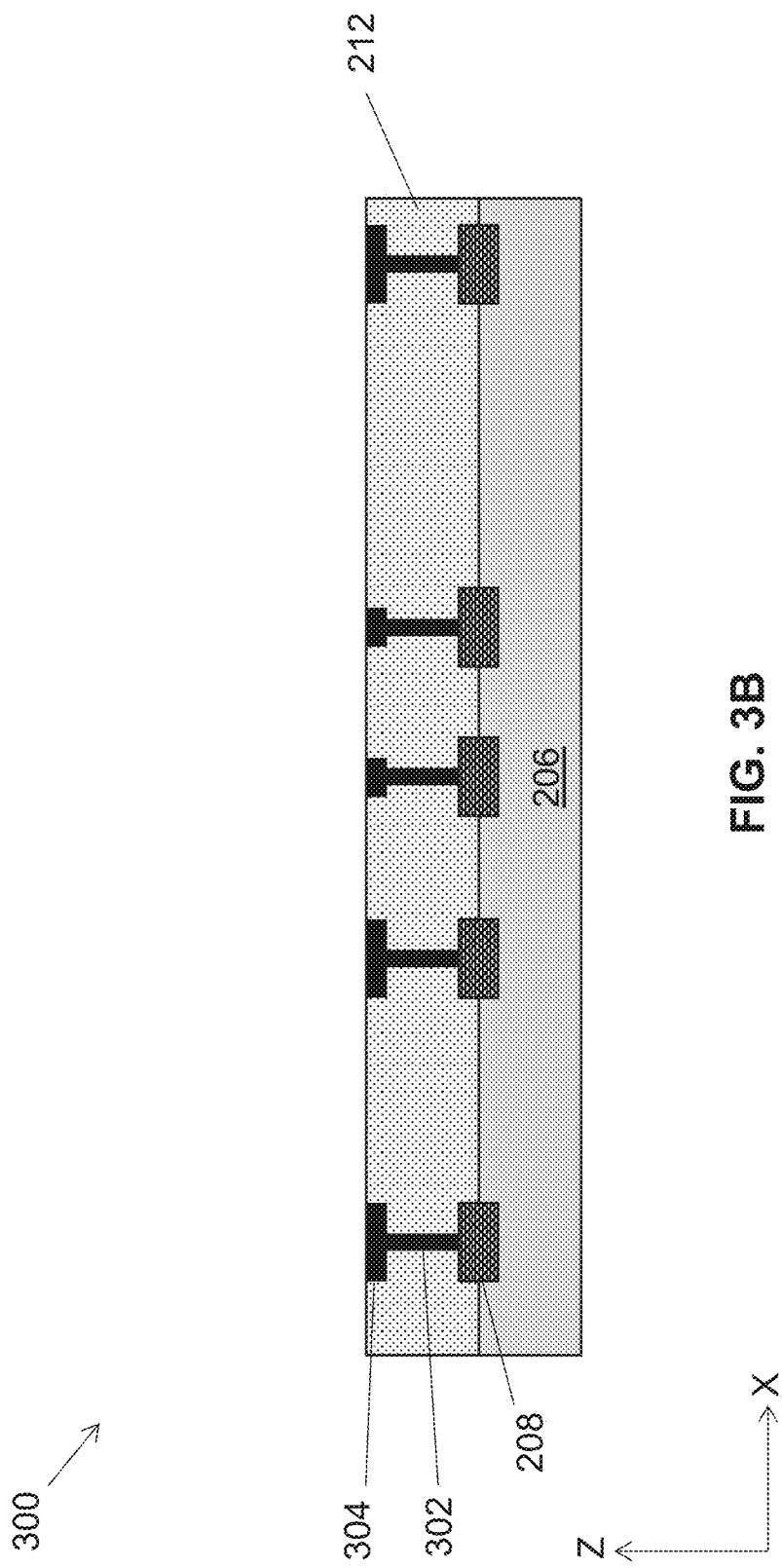
Figure 3C:
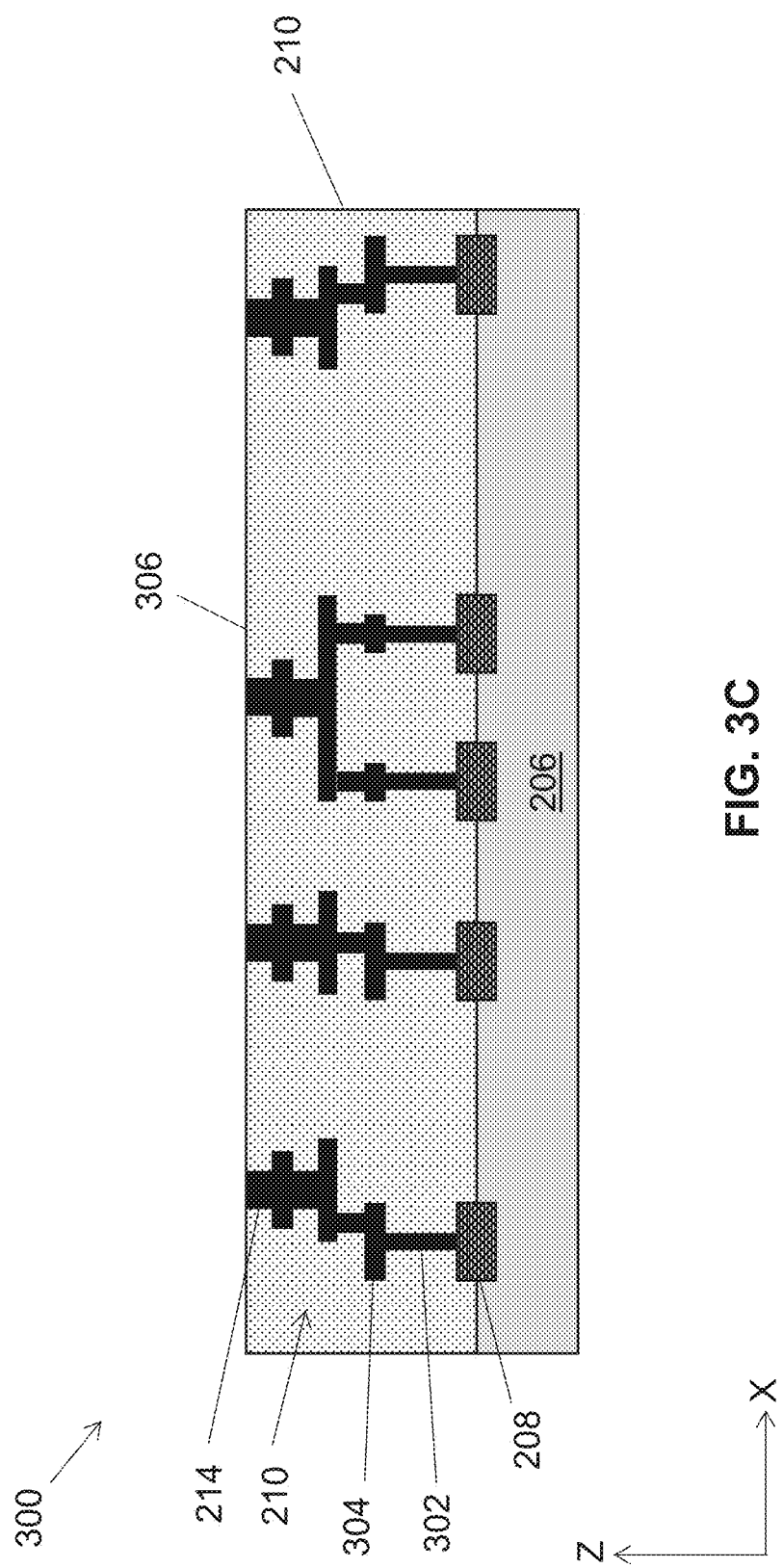

For illustrative purposes, similar or same parts in a three-dimensional NAND device are labeled using same element numbers. However, element numbers are merely used to distinguish relevant parts in the Detailed Description and do not indicate any similarity or difference in functionalities, compositions, or locations. Memory device 200 illustrated in FIG. 2 provides a side view of a three-dimensional NAND memory device, according to some embodiments. FIGS. 3A-3C illustrate an example fabrication process for forming a part of the three-dimensional NAND memory device, according to some embodiments. FIGS. 4A-4D illustrate an example fabrication process for forming another part of the three-dimensional NAND memory device, according to some embodiments. FIGS. 5A-5C illustrate an example fabrication process for bonding structures together to form the three-dimensional NAND memory device, according to some embodiments. Other parts of the memory devices are not shown for ease of description. Although using three-dimensional NAND devices as examples, in various applications and designs, the disclosed structures can also be applied in similar or different semiconductor devices to, e.g., reduce the density of metal connections or wiring. The specific application of the disclosed structures should not be limited by the embodiments of the present disclosure. For illustrative purposes, word lines and gate electrodes are used interchangeably to describe the present disclosure.

FIG. 2 illustrates an exemplary memory device 200, according to some embodiments. Memory device 200 includes a first semiconductor structure 202 and a second semiconductor structure 204 bonded together at a bond interface 205. Each of first semiconductor structure 202 and second semiconductor structure 204 includes a plurality of different material layers formed over a substrate. In some embodiments, first semiconductor structure 202 is fabricated separately from second semiconductor structure 204.

First semiconductor structure 202 includes a substrate 206. Substrate 206 can provide a platform for forming subsequent structures. Such subsequent structures are formed on a front (e.g., top) surface of substrate 206. And such subsequent structures are said to be formed in a vertical direction (e.g., orthogonal to the front surface of substrate 206.) In FIG. 2, and for all subsequent illustrated structures, the X and Y directions are along a plane parallel to the front and back surfaces of substrate 206, while the Z direction is in a direction orthogonal to the front and back surfaces of substrate 206.

In some embodiments, substrate 206 includes any suitable material for forming the three-dimensional memory device. For example, substrate 206 can include silicon, silicon germanium, silicon carbide, silicon on insulator (SOI), germanium on insulator (GOI), glass, gallium nitride, gallium arsenide, and/or other suitable III-V compound.

Substrate 206 of first semiconductor structure 202 can include one or more peripheral devices 208. Peripheral devices 208 can be formed "on" substrate 206, in which the entirety or part of the peripheral device 208 is formed in substrate 206 (e.g., below the top surface of substrate 206) and/or directly on substrate 206. Any of peripheral devices 208 can include transistors formed on substrate 206. Doped regions to form source/drain regions of the transistors can be formed in substrate 206 as well, as would be understood to one skilled in the relevant art.

In some embodiments, peripheral devices 208 can include any suitable digital, analog, and/or mixed-signal peripheral circuits used for facilitating the operation of memory device 200. For example, peripheral devices 208 can include one or more of a page buffer, a decoder (e.g., a row decoder and a column decoder), a sense amplifier, a driver, a charge pump, a current or voltage reference, or any active or passive components of the circuits (e.g., transistors, diodes, resistors, or capacitors). In some embodiments, peripheral devices 208 are formed on substrate 206 using complementary metal-oxide-semiconductor (CMOS) technology (also known as a "CMOS chip").

First semiconductor structure 202 can include one or more peripheral interconnect layers 210 above peripheral devices 208 to transfer electrical signals to and from peripheral devices 208. Peripheral interconnect layers 210 can include one or more contacts and one or more interconnect conductor layers, such as a top conductor layer 214, each including one or more interconnect lines and/or vias. As used herein, the term "contact" can broadly include any suitable types of interconnects, such as middle-end-of-line (MEOL) interconnects and back-end-of-line (BEOL) interconnects, including vertical interconnect accesses (e.g., vias) and lateral lines (e.g., interconnect lines). Peripheral interconnect layers 210 can further include one or more interlayer dielectric (ILD) layers, generally represented by dielectric material 212. The contacts and the conductor layers in peripheral interconnect layers 210 can include conductor materials including, but not limited to, tungsten (W), cobalt (Co), copper (Cu), aluminum (Al), silicides, or any combination thereof. Dielectric material 212 can include silicon oxide, silicon nitride, silicon oxynitride, doped silicon oxide, or any combination thereof.

Second semiconductor structure 204 includes a substrate 216 that may have similar properties to substrate 206. In some embodiments, substrate 216 is a different material than substrate 206.

A layer stack 218 that includes alternating conductor and insulator layers is disposed on a first surface (e.g., front surface) of substrate 216. Any number of alternating conductor/insulator layers may be used in layer stack 218. The conductor layers can each have the same thickness or have different thicknesses. Similarly, the insulator layers can each have the same thickness or have different thicknesses. The conductor layers can include conductor materials including, but not limited to, W, Co, Cu, Al, doped silicon, silicides, or any combination thereof. The insulator layers can include dielectric materials including, but not limited to, silicon oxide, silicon nitride, silicon oxynitride, or any combination thereof. In some embodiments, the insulator layers represent empty space (e.g., vacuum).

Extending vertically through layer stack 218, and over the first surface of substrate 216, is a plurality of structures 220. Plurality of structures 220 can include any number of NAND memory strings 222 and/or conductive contacts 224. Each of NAND memory strings 222 provides a plurality of memory bit locations controlled by voltage applied to corresponding word lines (e.g., the conductor layers of layer stack 218). The conductive top and bottom portions of each of NAND memory strings 222 are coupled to bit lines that control current flow through a channel layer of each NAND memory string 222.

Conductive contacts 224 can be through array contacts (TAC). Conductive contacts 224 can extend through layer stack 218 and deliver signals to conductive layers or pads disposed both above and below layer stack 218.

According to some embodiments, second semiconductor structure 204 includes two different levels of contacts lines for making contact with each of plurality of structures 220. For example, a first set of conductive lines 228 can be located on one side of plurality of structures 220 (in the z direction), and a second set of conductive lines 234 can be located on an opposite side of plurality of structures 220 (in the z direction). Each of first and second sets of conductive lines 228 and 234 can include bit lines coupled to one or more of NAND memory strings 222, word lines coupled to the conductive layers of layer stack 218 using conductive vias 226, and other contact lines coupled to conductive contacts 224. By splitting such conductive lines between separate locations, the density of the lines in a single location is decreased, leading to reduced cross-talk and faster operation speeds of memory device 200.

The various conductive lines may be staggered between first set of conductive lines 228 and second set of conductive lines 234 in any fashion. The staggering of the conductive lines can create a comb-like arrangement of the conductive lines. In one example, each of conductive contacts 224 is connected to a corresponding contact line in second set of conductive lines 234, and each of NAND memory strings 222 is connected to a corresponding bit line in first set of conductive lines 228. In another example, the conductive lines alternate between being located in either first set of conductive lines 228 or second set of conductive lines along the x-direction for each of plurality of structures 220. In yet another example, the bit lines connected to NAND memory strings 222 are staggered such that the bit lines alternate between being located in first set of conductive lines 228 and second set of conductive lines 234 along the x-direction for each of NAND memory strings 222. Any other arrangements are possible as well, so long as the conductive lines coupled to each of plurality of structures 220 are not all located along the same plane.

In some embodiments, any first set of structures of plurality of structures 220 can be coupled to conductive lines in the first set of conductive lines 228, and any second set of structures of plurality of structures 220 can be coupled to conductive lines in the second set of conductive lines 234. In some embodiments, the first set of structures can include all NAND memory strings 222 and the second set of structures can include all conductive contacts 224. The first set of structures can be different than the second set of structures. Furthermore, in some embodiments, the first set of structures includes entirely different structures than the second set of structures.

In some embodiments, second set of conductive lines 234 are disposed over an opposite surface (e.g., back surface) of substrate 216 in the z-direction. Another dielectric material 236 can also be present over the back surface of substrate 216, and surrounding second set of conductive lines 234. Dielectric material 236 can have substantially the same properties as dielectric material 212. Similarly, another dielectric material 235 is disposed over the front surface of substrate 216 to surround and protect the various conductive lines and vias. Dielectric material 235 can have substantially the same properties as either dielectric material 212 or dielectric material 236.

Second semiconductor structure 204 includes one or more interconnect layers 230 having substantially the same properties as peripheral interconnect layers 210. Interconnect layers 230 can include a conductor layer 232. According to some embodiments, conductor layer 232 of interconnect layers 230 and conductor layer 214 of peripheral interconnect layers 210 contact one another at bond interface 205.

Depending on the orientation of memory device 200 in a chip package, conductive pads designed to provide electrical connection to external devices can be provided along either a first surface 238 closer to substrate 216, or along a second surface 240 of substrate 206. These pads have not been illustrated for clarity, but their use would be well understood to a person skilled in the relevant art.

FIGS. 3A-3C illustrate an example fabrication process for forming a semiconductor device 300. In some embodiments, semiconductor device 300 provides a portion of memory device 200. FIG. 3A illustrates the formation of peripheral devices 208 on substrate 206. Peripheral devices 208 can include a plurality of transistors formed on substrate 206. The transistors can be formed by a plurality of processing steps including, but not limited to, photolithography, dry/wet etch, thin film deposition, thermal growth, implantation, chemical mechanical polishing (CMP), or any combination thereof. In some embodiments, doped regions are formed in substrate 206, which function, for example, as source regions and/or drain regions of the transistors. In some embodiments, isolation regions, such as shallow trench isolation (STI), is also formed in substrate 206. These particular features are not explicitly illustrated as they are well understood structures to a person skilled in the relevant art. Any arrangement of transistors or electrically passive devices (e.g., capacitors, resistors, etc.) may be provided on substrate 206.

FIG. 3B illustrates the formation of a first interconnect layer above peripheral devices 208. The first interconnect layer includes one or more contacts 302 and patterned conductor layers 304. Contacts 302 can be provided to contact either patterned features of peripheral devices 208 or portions of substrate 206. Conductor layers 304 represent conductive traces that extend into and out of the page. Contacts 302 and patterned conductor layers 304 can include conductor materials deposited by one or more thin film deposition processes including, but not limited to, CVD, PVD, ALD, electroplating, electroless plating, or any combination thereof. Fabrication processes to form the contacts and conductor layers can also include photolithography, CMP, wet/dry etch, or any combination thereof.

One or more deposited dielectric layers are represented by dielectric material 212. Dielectric material 212 can represent any number of deposited dielectric layers that include materials deposited by one or more thin film deposition processes including, but not limited to, CVD, PVD, ALD, or any combination thereof.

FIG. 3C illustrates the formation of one or more additional interconnect layers to form peripheral interconnect layers 210. Any number of interconnect layers may be formed each having vias connecting different levels of conductor layers. Additional dielectric layers are also deposited to increase a total thickness of dielectric material 212.

According to some embodiments, a top conductor layer 214 is formed along a top surface 306 of semiconductor device 300. Top surface 306 can be polished using CMP such that the surface is smooth across both dielectric material 210 and top conductor layer 214.

Figure 4A:
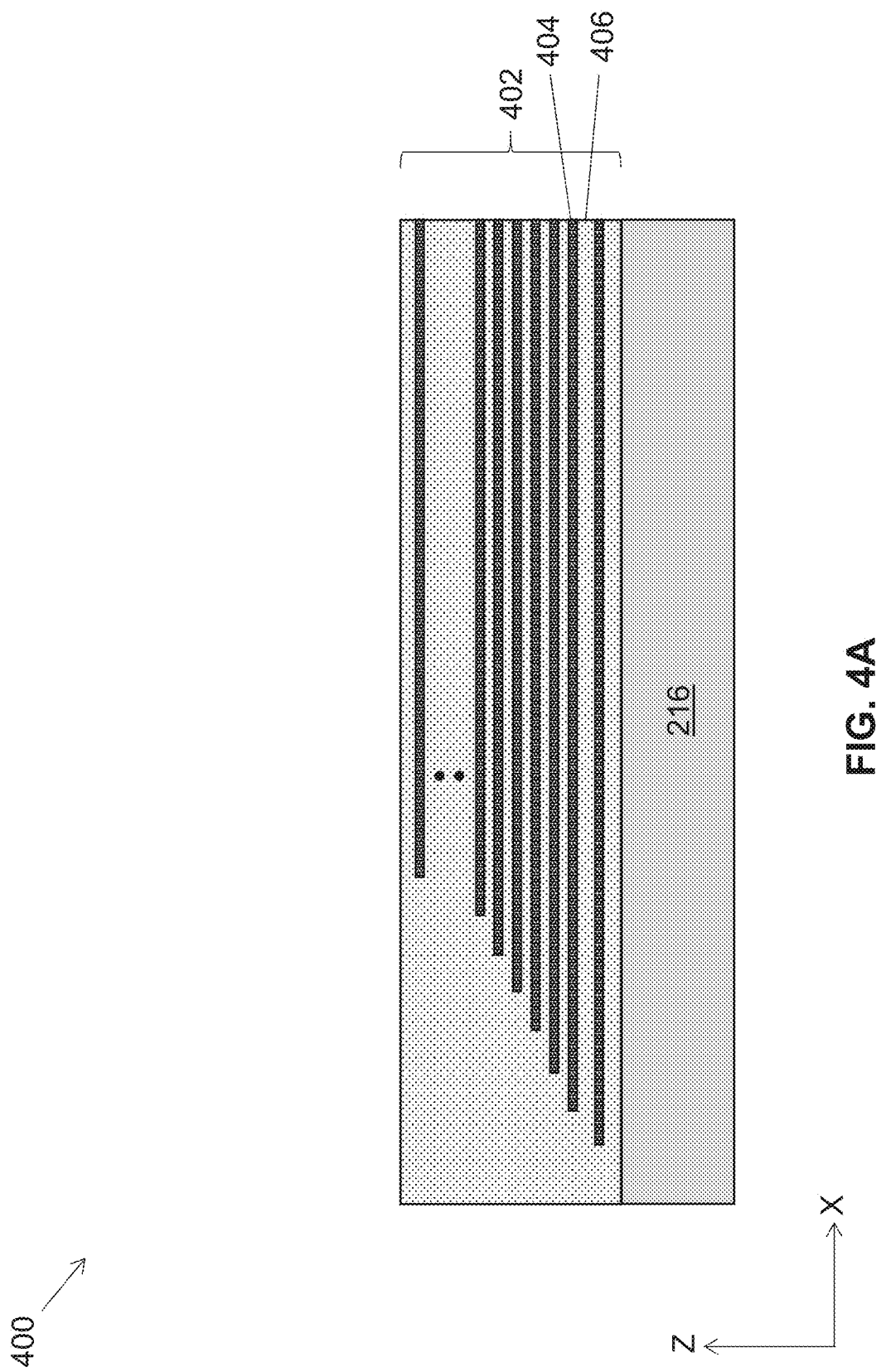
FIGS. 4A-4D illustrate side views of a three-dimensional memory structure at different stages of an exemplary fabrication process, according to some embodiments.

FIGS. 4A-4D illustrate an example fabrication process for forming a semiconductor device 400. In some embodiments, semiconductor device 400 provides a portion of memory device 200. FIG. 4A illustrates the formation of a layer stack 402 having alternating sacrificial layers 404 and dielectric layers 406 formed over substrate 216, according to some embodiments.

The formation of layer stack 402 can involve depositing sacrificial layers 404 to each have the same thickness or to have different thicknesses. Example thicknesses of sacrificial layers 404 can range from 20 nm to 500 nm. Similarly, dielectric layers 406 can each have the same thickness or have different thicknesses. Example thicknesses of dielectric layers 406 can range from 20 nm to 500 nm.

The dielectric material of sacrificial layers 404 is different from the dielectric material of dielectric layers 406, according to some embodiments. For example, each of sacrificial layers 404 can be silicon nitride while each of dielectric layers 406 can be silicon dioxide. Other example materials for each of sacrificial layers 404 include poly-crystalline silicon, poly-crystalline germanium, and poly-crystalline germanium-silicon. The dielectric materials used for any of dielectric layers 406 or sacrificial layers 404 can include silicon oxide, silicon nitride, silicon oxynitride, or any combination thereof. It should be understood that any number of dielectric layers may be included in layer stack 402.

Layer stack 402 includes a portion having a staircase structure where each of at least sacrificial layers 404 terminate at a different length in the horizontal 'X' direction. This staircase structure allows for electrical contact to connect each of the word lines of the memory device, as will be shown later.

Figure 4B:
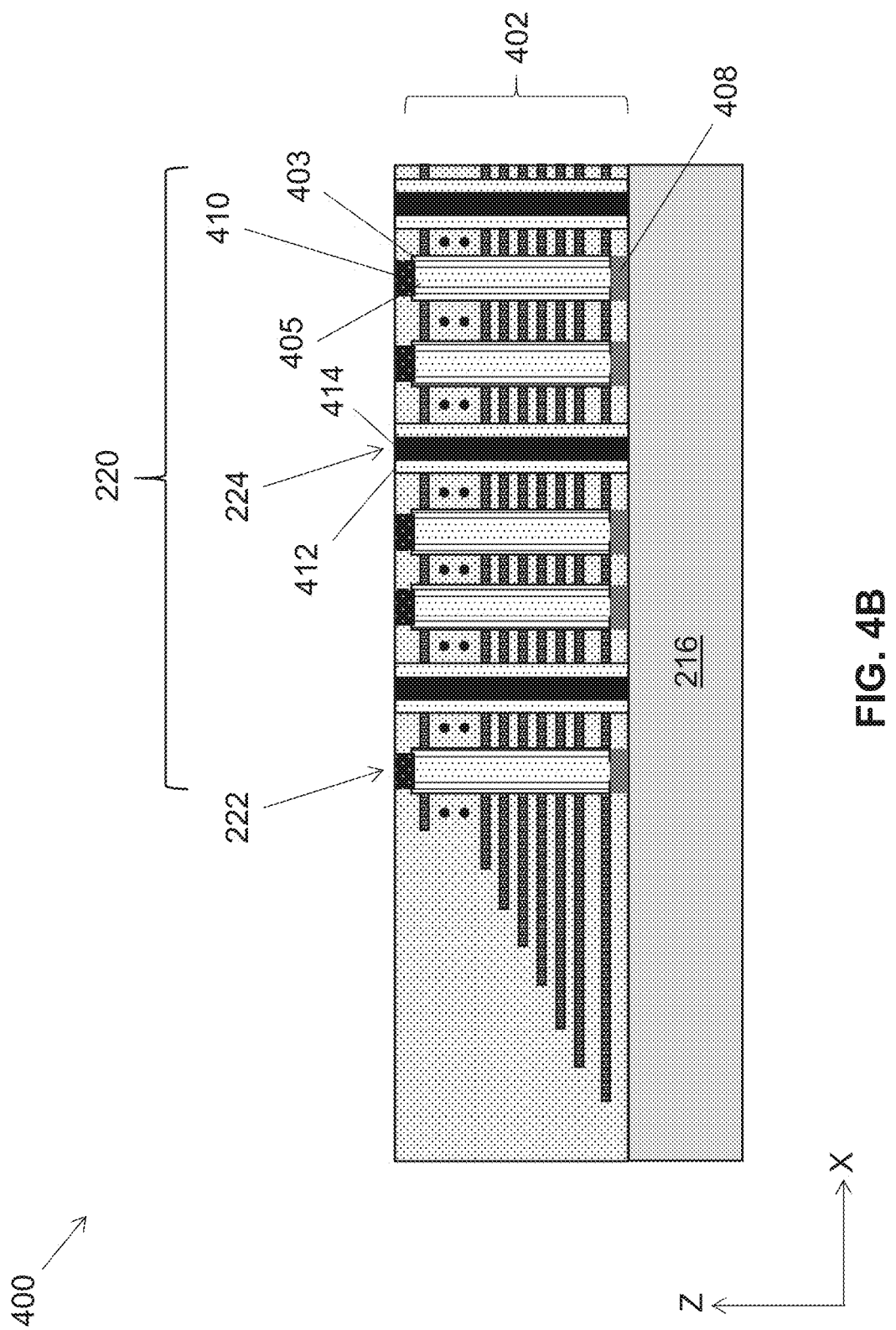
Figure 5A:
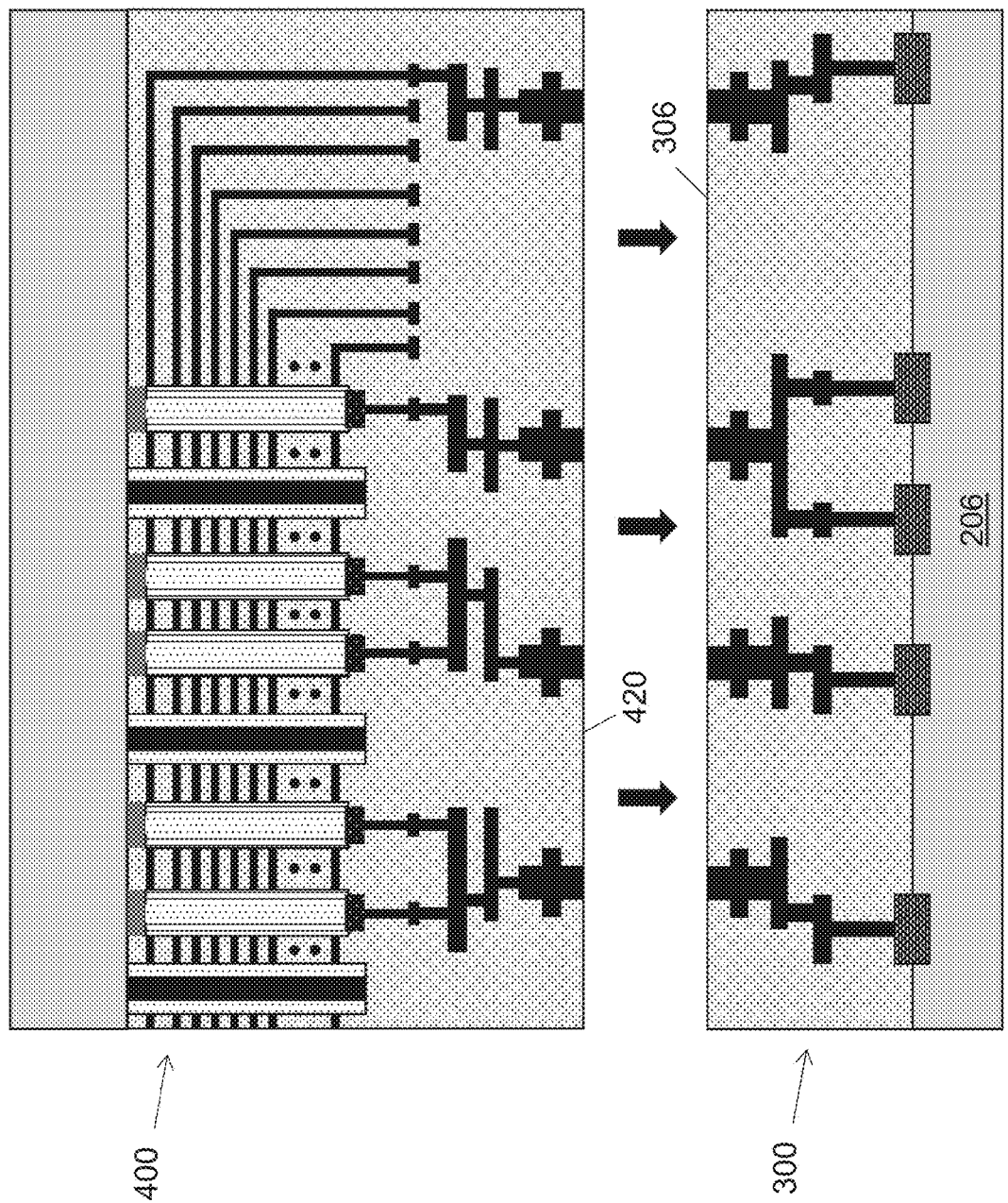
FIGS. 5A-5C illustrate side views of a three-dimensional memory structure at different stages of an exemplary fabrication process, according to some embodiments.
Figure 5B:
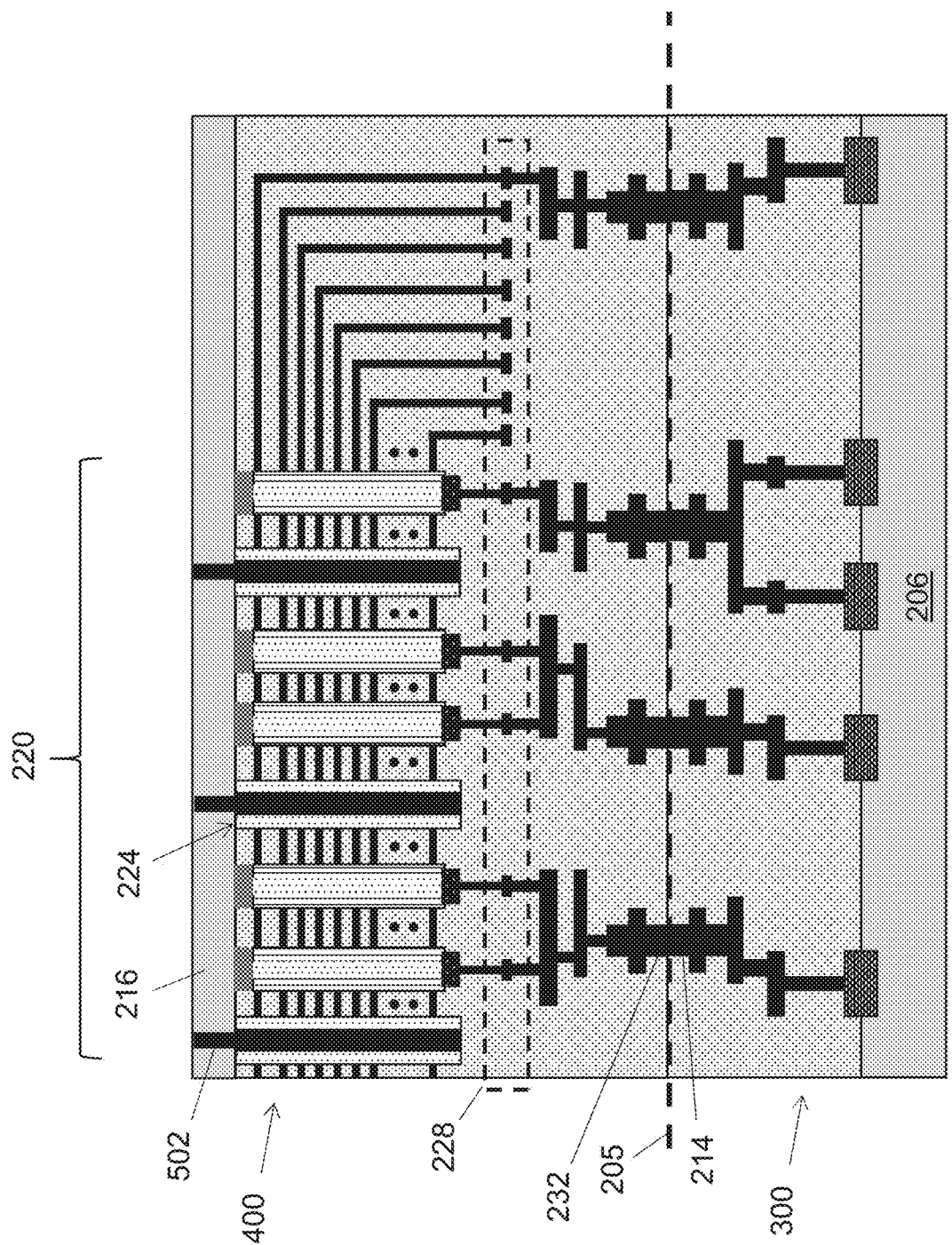
Figure 5C:
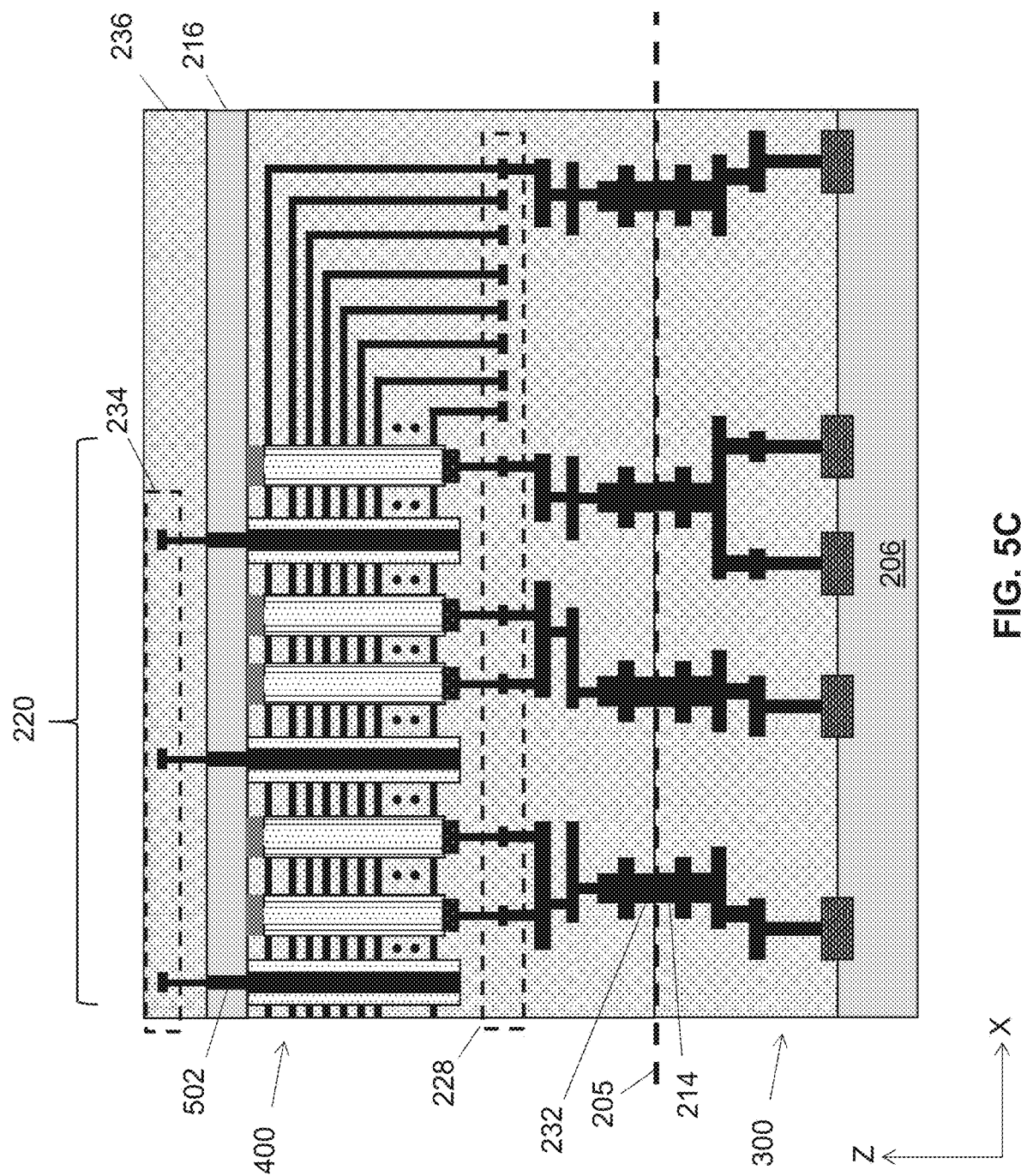

FIG. 4B illustrates the formation of vertical structures 220 through layer stack 402, according to some embodiments. Vertical structures 220 includes both NAND memory strings 222 and conductive contacts 224.

In some embodiments, NAND memory strings 222 include a plurality of memory layers 403 and a core insulator material 405 that extend between an epitaxially grown material 408 on substrate 216 and a top conductive material 410. Epitaxially grown material 408 can include epitaxially grown silicon, and may extend into a portion of substrate 216. Top conductive material may include doped polysilicon or any other conductive material.

Plurality of memory layers 403 of each NAND memory string 222 can include a semiconductor channel layer, such as amorphous silicon, polysilicon, or single crystalline silicon. Plurality of memory layers 403 can also include a tunneling layer, a storage layer (also known as "charge trap/storage layer"), and a blocking layer. The blocking layer, the storage layer, the tunneling layer, and the semiconductor channel layer are arranged over one another on the sidewalls in the order listed (with the blocking layer deposited first and the semiconductor channel layer deposited last), according to some embodiments. The tunneling layer can include silicon oxide, silicon nitride, or any combination thereof. The blocking layer can include silicon oxide, silicon nitride, high dielectric constant (high-k) dielectrics, or any combination thereof. The storage layer can include silicon nitride, silicon oxynitride, silicon, or any combination thereof. In some embodiments, plurality of memory layers 404 includes silicon oxide/silicon nitride/silicon oxide (ONO) dielectrics (e.g., a tunneling layer including silicon oxide, a storage layer including silicon nitride, and a blocking layer including silicon oxide). Core insulator 406 can be any dielectric material, such as oxide, for example. In some embodiments, plurality of memory layers 403 surround core insulator 405. A diameter of NAND memory strings 222 can be between about 100 nm and 200 nm.

In some embodiments, the formation of NAND memory strings 222 includes etching a plurality of openings through layer stack 402 and into a portion of substrate 216. Epitaxially grown material 408 is then formed at the bottom of the plurality of openings, followed by deposition of plurality of memory layers 403 and deposition of core insulator 405, such that plurality of memory layers 403 surround core insulator 405. Top conductive material 410 can be formed over plurality of memory layers 403 and core insulator 405, and may be formed after etching a top portion of memory layers 403 and core insulator 405. Each of the various layers of plurality of memory layers 403 can be formed using any suitable deposition technique, such as sputtering, evaporation, or chemical vapor deposition (CVD). Example CVD techniques include plasma-enhanced CVD (PECVD), low pressure CVD (LPCVD), and atomic layer deposition (ALD). Similarly, core insulator 405 can be formed using any of the techniques described above.

Conductive contacts 224 can be TACs that each include a conductive core 414 surrounding by an insulating material 412. Conductive core 414 can include conductor materials including, but not limited to, tungsten (W), cobalt (Co), copper (Cu), aluminum (Al), silicides, or any combination thereof. Insulating material 412 can include silicon oxide, silicon nitride, silicon oxynitride, doped silicon oxide, or any combination thereof. Conductive core 414 and insulating material 412 can each be formed using any suitable deposition technique, such as sputtering, evaporation, or chemical vapor deposition (CVD). Example CVD techniques include plasma-enhanced CVD (PECVD), low pressure CVD (LPCVD), and atomic layer deposition (ALD).

According to some embodiments, a chemical mechanical polishing process (CMP) can be performed to planarize a top surface of semiconductor device 400 following the formation of plurality of vertical structures 220.

Figure 4C:
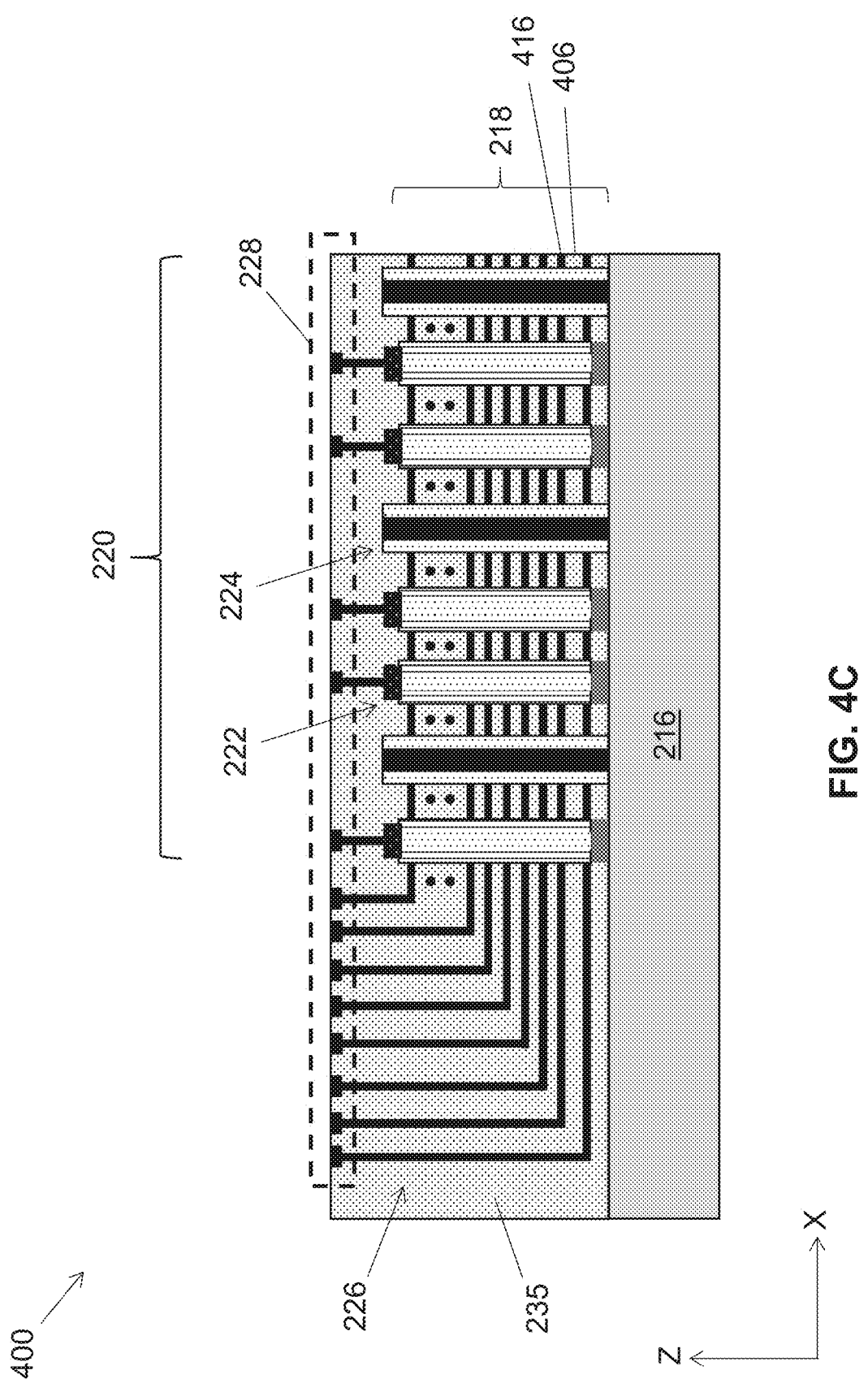

FIG. 4C illustrates additional fabricated structures and layers on semiconductor device 400. According to some embodiments, sacrificial layers 404 of layer stack 402 are removed and replaced with conductor layers 416 to form layer stack 218 having alternating conductor layers 416 and dielectric layers 406. Conductor layers 416 can act as word lines for each of NAND memory strings 222. Sacrificial layers 404 can be removed by a suitable etching process, e.g., an isotropic dry etch or a wet etch. The etching process can have sufficiently high etching selectivity of the material of sacrificial layers 404 over the materials of other parts of the structure, such that the etching process can have minimal impact on the other parts of the structure. In some embodiments, sacrificial layers 404 include silicon nitride and the etchant of the isotropic dry etch includes one or more of $CF_4$, $CHF_3$, $C_4F_8$, $C_4F_6$, and $CH_2F_2$. The radio frequency (RF) power of the isotropic dry etch can be lower than about 100 W and the bias can be lower than about 10 V. In some embodiments, sacrificial layers 404 include silicon nitride and the etchant of the wet etch includes phosphoric acid. In some embodiments, dielectric layers 406 can be removed such that empty space (vacuum) exists between conductor layers 416. The vacuum space between conductor layers 416 acts as an insulating layer and may help reduce parasitic capacitance.

Conductor layers 416 can include conductor materials including, but not limited to, W, Co, Cu, Al, doped silicon, silicides, or any combination thereof. Each of conductor layers 416 can be deposited into the regions left behind by the removal of sacrificial layers 404 using a suitable deposition method such as CVD, sputtering, MOCVD, and/or ALD.

Contact is made to each of conductor layers 416 using vias 226 extending through dielectric material 235. A first set of conductive lines 228 are formed to make electrical contact with one or more of the word lines and to one or more of NAND memory strings 222 and conductive contacts 224. First set of conductive lines 228 can include bit line contacts to NAND memory strings 222. Contrary to conventional techniques, not all vertical structures 220 include contact lines along the same plane as first set of conductive lines 228. For example, alternating vertical structures 220 along the x-direction include contact lines in first set of conductive lines 228. Other patterns are possible as well.

Figure 4D:
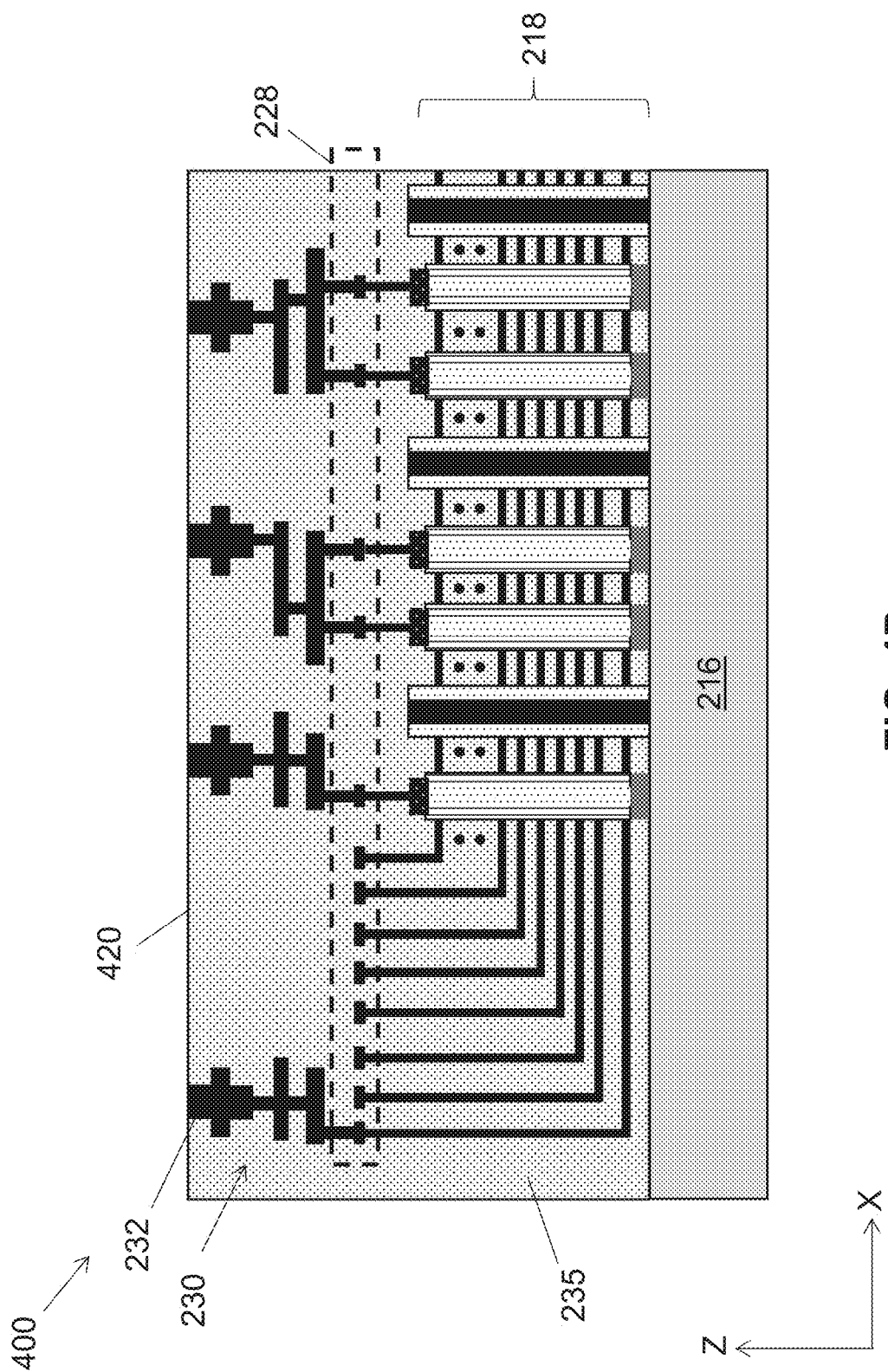

FIG. 4D illustrates the formation of one or more interconnect layers 230 making electrical connection with one or more of first set of conductive lines 228, according to some embodiments. Any number of interconnect layers may be formed with each having vias connecting different levels of conductor layers. Additional dielectric layers are also deposited to increase a total thickness of dielectric material 235.

According to some embodiments, a top conductor layer 232 is formed along a top surface 420 of semiconductor device 400. Top surface 420 can be polished using CMP such that the surface is smooth across both dielectric material 235 and top conductor layer 232.

FIGS. 5A-5C illustrate the bonding of semiconductor devices 300 and 400, and final fabrication procedures to form memory device 200. In FIG. 5A, semiconductor device 400 is brought together with semiconductor device 300 such that top surface 420 of semiconductor device 400 faces top surface 306 of semiconductor device 300.

FIG. 5B illustrates the bonding of semiconductor devices 300 and 400 at bond interface 205. The bonding may be performed using a hybrid bonding process where conductive portions on each of semiconductor devices 300 and 400 at bond interface 205 bond together and the dielectric material on each of semiconductor devices 300 and 400 at bond interface 205 bond together. According to some embodiments, top conductor layer 214 of semiconductor device 300 bonds with top conductor layer 232 of semiconductor device 400 at bond interface 205.

According to some embodiments, through-vias 502 are formed extending through a thickness of substrate 216. Openings may be formed on an opposite (e.g., backside) of substrate 216 and conductive material such as W, Co, Cu, Al, doped silicon, silicides, or any combination thereof, fills the openings to form through-vias 502. According to some embodiments, through-vias 502 are used to contact any of vertical structures 220 that do not include a contact within first set of conductive lines 228. Through-vias 502 can also be used to contact any conductive contacts 224.

In some embodiments, substrate 216 is thinned before the formation of through-vias 502. Substrate 216 can be thinned using any known procedure, such as CMP or chemical etching. Substrate 216 can be thinned to final thickness of less than 100 µm, less than 50 µm, or less than 10 µm. In some embodiments, substrate 216 is thinned before semiconductor device 400 is bonded with semiconductor device 300.

FIG. 5C illustrates the formation of second set of conductor lines 234 to make contact with through-vias 502, according to some embodiments. One or more dielectric layers represented as dielectric material 236 can be deposited over the backside of substrate 216 to facilitate the formation of second set of conductor lines 234 using standard lithography techniques. By forming various ones of the conductive bit lines and other contact lines on opposite sides of vertical structures 220, the density of conductive lines along any one plane is greatly reduced.

Figure 6:
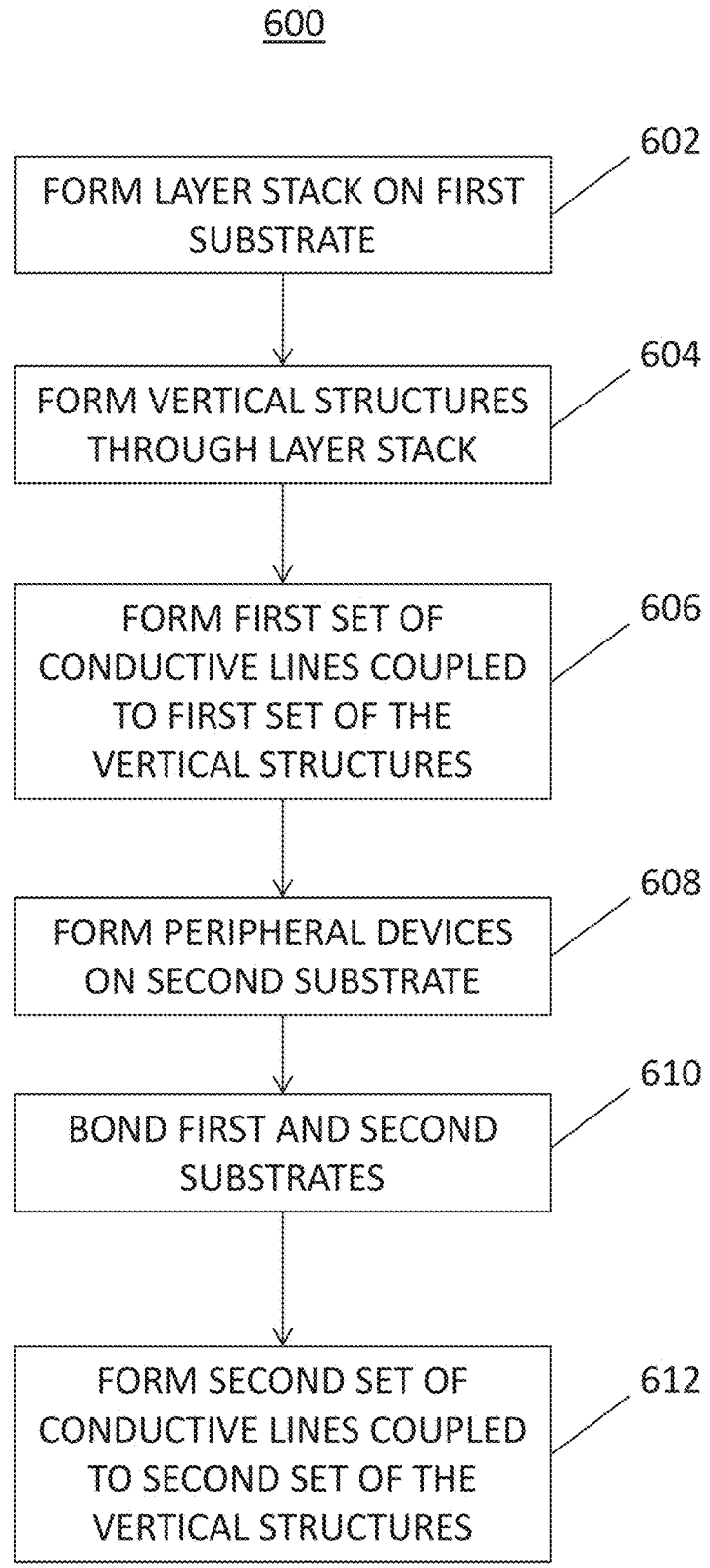
FIG. 6 is an illustration of a fabrication process for forming a three-dimensional memory structure, according to some embodiments.

FIG. 6 is a flowchart of an exemplary method 600 for forming a NAND memory device, according to the first embodiment. The operations of method 600 are generally illustrated in FIGS. 3-5. It should be understood that the operations shown in method 600 are not exhaustive and that other operations can be performed as well before, after, or between any of the illustrated operations. In various embodiments of the present disclosure, the operations of method 600 can be performed in a different order and/or vary.

In operation 602, a layer stack having alternating conductor and insulator layers is formed on a first substrate. The formation of the layer stack can involve first depositing alternating types of dielectric materials (e.g., sacrificial layers alternating with dielectric layers). The layers of the alternating dielectric stack can include materials including, but not limited to, silicon oxide, silicon nitride, silicon oxynitride, or any combination thereof. The layers of the alternating dielectric stack can include dielectric materials deposited by one or more thin film deposition processes including, but not limited to, CVD, PVD, ALD, or any combination thereof. At a later time, the sacrificial layers can be removed and replaced by conductor layers to form the alternating conductor and insulator layers. The insulator layers may be dielectric layers, or may be regions of vacuum between the conductor layers.

In operation 604, a plurality of vertical structures are formed through the layer stack. The vertical structures can include one or more NAND memory strings having a plurality of memory layers surrounding a core insulator. Forming the plurality of memory layers may include depositing a semiconductor channel layer, such as amorphous silicon, polysilicon, or single crystalline silicon, a tunneling layer, a storage layer (also known as "charge trap/storage layer"), and a blocking layer. The blocking layer, the storage layer, the tunneling layer, and the semiconductor channel layer may each be deposited in the order listed on the sidewalls of the one or more first openings, according to some embodiments. The tunneling layer can include silicon oxide, silicon nitride, or any combination thereof. The blocking layer can include silicon oxide, silicon nitride, high dielectric constant (high-k) dielectrics, or any combination thereof. The storage layer can include silicon nitride, silicon oxynitride, silicon, or any combination thereof. In some embodiments, the plurality of memory layers includes silicon oxide/silicon nitride/silicon oxide (ONO) dielectrics (e.g., a tunneling layer including silicon oxide, a storage layer including silicon nitride, and a blocking layer including silicon oxide).

Other vertical structures can include conductive contacts such as TACs that include a core conductive material that extends vertically through the layer stack to make electrical connection with structures on both sides of the layer stack.

In operation 606, a first set of conductive lines is formed that is coupled to a first set of the vertical structures. The first set of conductive lines can be formed vertically distanced from one end of the vertical structures with connection made to the vertical structures using vias. The first set of conductive lines can be formed along the same plane, and can be made up of bit lines, word lines, and contact lines for the vertical conductive contacts.

According to some embodiments, the first set of conductive lines are not connected to each of the vertical structures, but only to a first set of the vertical structures. The first set of the vertical structures can include any number of NAND strings and vertical conductive contacts. In one example, the first set of vertical structures includes only the NAND strings.

In operation 608, peripheral devices are formed on a second substrate. The Peripheral devices can include a plurality of transistors formed on the second substrate. The peripheral devices can include any arrangement of transistors or electrically passive devices (e.g., capacitors, resistors, etc.) The transistors can be formed by a plurality of processing steps including, but not limited to, photolithography, dry/wet etch, thin film deposition, thermal growth, implantation, chemical mechanical polishing (CMP), or any combination thereof. In some embodiments, doped regions are formed in the second substrate, which function, for example, as source regions and/or drain regions of the transistors. In some embodiments, isolation regions, such as shallow trench isolation (STI), is also formed in the second substrate.

One or more interconnect layers are also formed above the peripheral devices in operation 608. The one or more interconnect layers can have an exposed conductor layer present at a top surface of the structure.

In operation 610, the first and second substrates are bonded together at a bond interface between the first and second substrates. The bonding can be a hybrid bond where conductive portions at the bond interface bond together separately from the dielectric portions at the bond interface. A conductor layer formed over the first substrate contacts a conductor layer formed over the second substrate at the bond interface, according to some embodiments.

In operation 612, a second set of conductive lines is formed that is coupled to a second set of the vertical structures. The second set of vertical structures is different from the first set of vertical structures, though some of the vertical structures may be in both the first and second sets. According to some embodiments, the second set of vertical structures can include any number of NAND strings and vertical conductive contacts. In one example, the second set of vertical structures includes only the vertical conductive contacts.

According to some embodiments, the second set of conductive lines are formed on a different plane than the first set of conductive lines either above or below the plurality of vertical structures. In one example, the second set of conductive lines can be formed over an opposite side (e.g., backside) of the first substrate and electrically coupled to the second set of the vertical structures through vias formed through a thickness of the first substrate. The second set of conductive lines can be formed over an opposite end vertically distanced from the plurality of vertical structures compared to the first set of conductive lines. By staggering the position of the various conductive lines on two different planes, the density of conductive lines on a given plane is reduced.

The present disclosure describes various embodiments of three-dimensional memory devices and methods of making the same. In some embodiments, a memory device includes a first semiconductor structure and a second semiconductor structure. The first semiconductor structure includes a first substrate and one or more peripheral devices on the first substrate. The first semiconductor structure also includes one or more interconnect layers having a first conductor layer. The second semiconductor structure includes a second substrate and a layer stack having alternating conductor and insulator layers disposed above a first surface of the second substrate. The second semiconductor structure also includes a plurality of structures extending vertically through the layer stack. The second semiconductor structure also includes a first set of conductive lines electrically coupled with a first set of the plurality of structures and a second set of conductive lines electrically coupled with a second set of the plurality of structures different from the first set. The first set of conductive lines are vertically distanced from one end of the plurality of structures and the second set of conductive lines are vertically distanced from an opposite end of the plurality of structures.

In some embodiments, a memory device includes a substrate and a layer stack having alternating conductor and insulator layers disposed above a first surface of the substrate. The memory device also includes a plurality of structures extending vertically through the layer stack. The memory device also includes a first set of conductive lines electrically coupled with a first set of the plurality of structures and a second set of conductive lines electrically coupled with a second set of the plurality of structures different from the first set. The first set of conductive lines are vertically distanced from one end of the plurality of structures and the second set of conductive lines are vertically distanced from an opposite end of the plurality of structures. The memory device also includes one or more interconnect layers having a first conductor layer at a top surface of the memory device, and a bond interface at the top surface of the memory device. Another semiconductor device is configured to bond with the memory device at the bond interface.

In some embodiments, a method to form a memory device includes forming a layer stack over a first substrate, the first layer stack including alternating conductor and insulator layers, and forming a plurality of structures extending vertically through the layer stack. The method also includes forming a first set of conductive lines over one end vertically distanced from the plurality of structures. The first set of conductive lines are electrically coupled to a first set of the plurality of structures. The method also includes forming one or more peripheral devices on a second substrate. The method further includes bonding the first substrate with the second substrate at a bond interface between the first substrate and the second substrate, and forming a second set of conductive lines over an opposite end vertically distanced from the plurality of structures. The second set of conductive lines are electrically coupled to a second set of the plurality of structures.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A memory device, comprising:
 one or more peripheral devices on a first substrate;
 a plurality of memory strings disposed above the one or more peripheral devices;
 one or more interconnect layers sandwiched between the one or more peripheral devices and the plurality of memory strings; and
 first and second sets of conductive lines vertically distanced from respective first and second ends of the plurality of memory strings, wherein the first set of conductive lines are electrically coupled with a first set of the plurality of memory strings.

2. The memory device of claim 1, wherein the second set of conductive lines are electrically coupled with a second set of the plurality of memory strings different from the first set of the plurality of memory strings.

3. The memory device of claim 1, further comprising:
 a layer stack having alternating conductor and insulator layers disposed above the one or more interconnect layers, wherein the plurality of memory strings extend through the layer stack.

4. The memory device of claim 3, further comprising:
 conductive contacts, extending vertically through the layer stack.

5. The memory device of claim 4, wherein the second set of conductive lines are electrically coupled with the conductive contacts.

6. The memory device of claim 1, further comprising:
 a plurality of conductive pads on the first substrate, configured to provide electrical connection to external devices.

7. The memory device of claim 1, wherein the plurality of memory strings each includes a plurality of layers surrounding a core insulating material, wherein the plurality of layers comprises a blocking layer, a storage layer, a tunneling layer, and a channel layer.

8. The memory device of claim 1, wherein the first and second sets of conductive lines are arranged in a comb-like arrangement.

9. The memory device of claim 1, wherein the first and second sets of conductive lines comprise bit lines or word lines.

10. The memory device of claim 1, further comprising:
a bond interface disposed between the one or more interconnect layers.

11. The memory device of claim 1, further comprising:
a second substrate disposed above the plurality of memory strings, wherein the first and second sets of conductive lines are on opposite sides of the second substrate.

12. The memory device of claim 11, further comprising:
a plurality of conductive pads disposed on the second substrate, and configured to provide electrical connection to external devices.

13. A method for forming a memory device, comprising:
forming a plurality of memory strings on a first substrate;
forming a first set of conductive lines vertically distanced from a first end of the plurality of memory strings, wherein the first set of conductive lines are electrically coupled to a first set of the plurality of memory strings and one or more first interconnect layers;
forming one or more second interconnect layers over a second substrate; and
bonding the first substrate with the second substrate at a bond interface between the one or more first interconnect layers and the one or more second interconnect layers.

14. The method of claim 13, wherein forming the plurality of memory strings comprises forming a layer stack having alternating conductor and insulator layers; and
forming the plurality of memory strings extending vertically through the layer stack.

15. The method of claim 13, further comprising:
forming one or more conductive pads on the first substrate, the one or more conductive pads being configured to provide electrical connection to external devices.

16. The method of claim 13, further comprising:
forming one or more conductive pads on the second substrate, the one or more conductive pads being configured to provide electrical connection to external devices.

17. The method of claim 13, further comprising:
forming a second set of conductive lines vertically distanced from a second end of the plurality of memory strings, wherein the first and second ends are on opposite sides of the plurality of memory strings.

18. The method of claim 17, wherein forming the second set of conductive lines comprises electrically coupling the second set of conductive lines to a second set of the plurality of memory strings different from the first set of the plurality of memory strings.

19. The method of claim 17, further comprising:
forming conductive contacts extending vertically through the first substrate; and
electrically coupling the second set of conductive lines to the conductive contacts.

20. The method of claim 17, wherein forming the second set of conductive lines comprises forming the first set of conductive lines and the second set of conductive lines in a comb-like arrangement.

* * * * *